(12) United States Patent
Pagaila et al.

(10) Patent No.: US 8,270,176 B2
(45) Date of Patent: Sep. 18, 2012

(54) EXPOSED INTERCONNECT FOR A PACKAGE ON PACKAGE SYSTEM

(75) Inventors: Reza Argenty Pagaila, Singapore (SG); Byung Tai Do, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 737 days.

(21) Appl. No.: 12/188,995

(22) Filed: Aug. 8, 2008

(65) Prior Publication Data

US 2010/0033941 A1 Feb. 11, 2010

(51) Int. Cl.
*H05K 7/00* (2006.01)

(52) U.S. Cl. ........ 361/760; 361/764; 361/782; 361/790; 361/792

(58) Field of Classification Search ............... 361/760, 361/761, 764, 777, 782, 790, 792, 795, 807, 361/809–810, 728, 729, 735–737, 748; 174/250, 174/255, 259, 260, 261
See application file for complete search history.

(56) References Cited

U.S. PATENT DOCUMENTS

| | | | | |
|---|---|---|---|---|
| 5,222,014 A * | 6/1993 | Lin | | 361/792 |
| 6,876,074 B2 | 4/2005 | Kim | | |
| 6,933,176 B1 | 8/2005 | Kirloskar et al. | | |
| 7,061,088 B2 | 6/2006 | Karnezos | | |
| 7,190,061 B2 | 3/2007 | Lee | | |
| 7,279,786 B2 | 10/2007 | Kim | | |
| 7,288,835 B2 | 10/2007 | Yim et al. | | |
| 7,288,841 B2 | 10/2007 | Yamano | | |
| 7,317,247 B2 | 1/2008 | Lee et al. | | |
| 7,345,361 B2 * | 3/2008 | Mallik et al. | | 257/686 |
| 2003/0071340 A1 * | 4/2003 | Derderian | | 257/686 |
| 2005/0090050 A1 * | 4/2005 | Shim et al. | | 438/200 |
| 2006/0073635 A1 | 4/2006 | Su et al. | | |
| 2006/0175695 A1 | 8/2006 | Lee | | |
| 2006/0180911 A1 | 8/2006 | Jeong et al. | | |
| 2006/0220209 A1 | 10/2006 | Karnezos et al. | | |
| 2006/0220210 A1 | 10/2006 | Karnezos et al. | | |
| 2006/0244157 A1 * | 11/2006 | Carson | | 257/787 |
| 2006/0267175 A1 | 11/2006 | Lee | | |
| 2006/0284299 A1 | 12/2006 | Karnezos | | |
| 2007/0148822 A1 * | 6/2007 | Haba et al. | | 438/110 |
| 2007/0190690 A1 | 8/2007 | Chow et al. | | |
| 2007/0216006 A1 | 9/2007 | Park et al. | | |
| 2007/0252249 A1 * | 11/2007 | Murai et al. | | 257/666 |
| 2007/0278696 A1 * | 12/2007 | Lu et al. | | 257/777 |
| 2007/0290376 A1 * | 12/2007 | Zhao et al. | | 257/787 |
| 2008/0230887 A1 * | 9/2008 | Sun et al. | | 257/686 |
| 2008/0258289 A1 | 10/2008 | Pendse et al. | | |
| 2009/0166834 A1 * | 7/2009 | Yoon et al. | | 257/686 |
| 2009/0236720 A1 | 9/2009 | Yoon et al. | | |
| 2010/0025833 A1 | 2/2010 | Pagaila et al. | | |

* cited by examiner

*Primary Examiner* — Hoa C Nguyen (74) *Attorney, Agent, or Firm* — Ishimaru & Associates LLP; Mikio Ishimaru; Stanley M. Chang (57) ABSTRACT

An integrated circuit package system includes: providing a substrate; mounting an integrated circuit above the substrate; connecting an interposer to the integrated circuit with a wire-in-film adhesive; connecting an exposed interconnect having an upper surface to the substrate; and encapsulating the integrated circuit with an encapsulation.

18 Claims, 4 Drawing Sheets

EXPOSED INTERCONNECT FOR A PACKAGE ON PACKAGE SYSTEM

CROSS-REFERENCE TO RELATED APPLICATION(S)

The present application contains subject matter related to co-pending U.S. patent application Ser. No. 12/057,360. The related application is assigned to STATS ChipPAC Ltd.

The present application contains subject matter related to co-pending U.S. patent application Ser. No. 12/053,751. The related application is assigned to STATS ChipPAC Ltd.

TECHNICAL FIELD

The present invention relates generally to integrated circuits and more particularly to a system for utilizing an exposed interconnect in a package on package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes: providing a substrate; mounting an integrated circuit above the substrate; connecting an interposer to the integrated circuit with a wire-in-film adhesive; connecting an exposed interconnect having an upper surface to the substrate; and encapsulating the integrated circuit with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Figure 1:
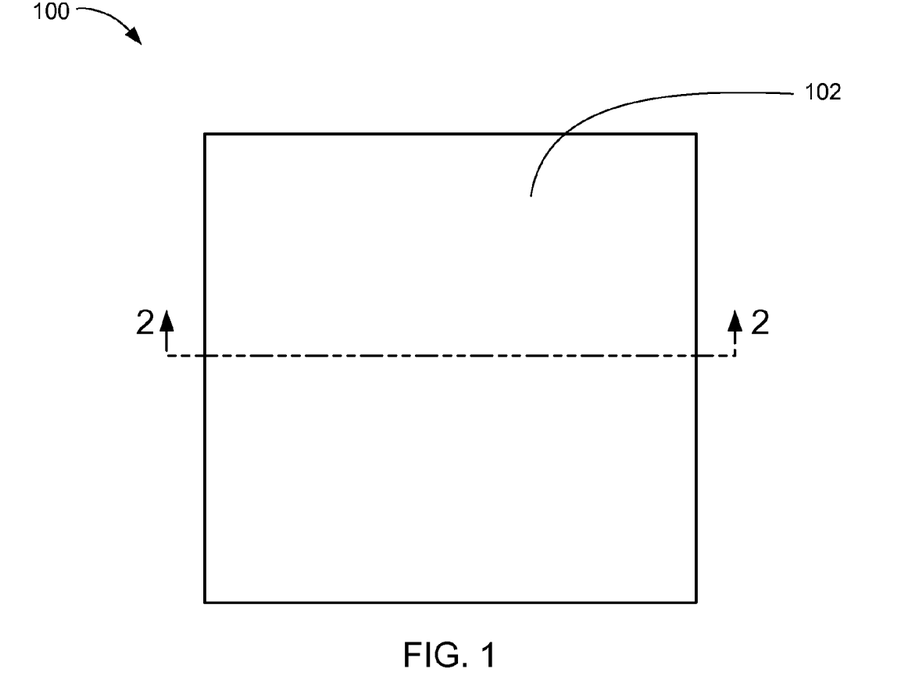
FIG. 1 is a top view of an integrated circuit package system in a first embodiment of the present invention.

Referring now to FIG. 1, therein is shown a top view of an integrated circuit package system 100 in a first embodiment of the present invention. The integrated circuit package system 100 is shown having a package such as a second package 102.

Figure 2:
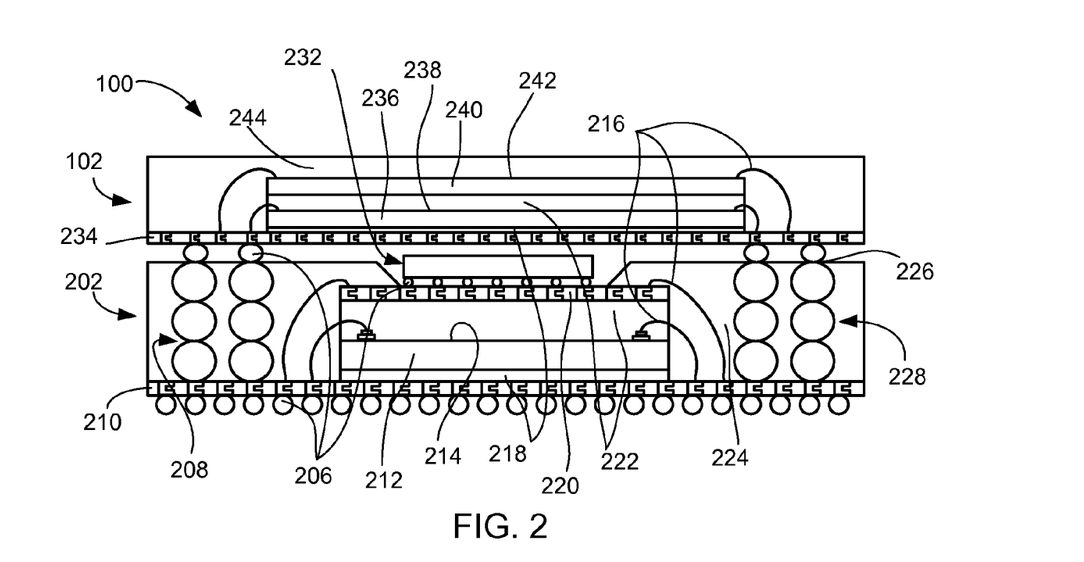
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having a first package 202 with the second package 102 mounted above.

The second package 102 is connected to the first package 202 with interconnects such as solder balls 206. The solder balls 206 connecting the first package 202 to the second package 102 are connected to exposed interconnects 208. The exposed interconnects 208 may be solder balls, conductive pins, or through vias.

It has been discovered that the use of the exposed interconnects 208 allow for an inexpensive solution to previously difficult and expensive problems of routing signals vertically through package on package systems.

The exposed interconnects 208 are mounted above a substrate 210 such as a laminated plastic or a ceramic substrate. Also mounted above the substrate 210 is an integrated circuit 212 such as a wire-bonded die with an active side 214.

The active side 214 is connected to the substrate 210 with interconnects such as bond wires 216. Below the substrate are mounted the solder balls 206.

The integrated circuit 212 is attached to the substrate 210 with a die attach adhesive 218. Mounted above the integrated circuit 212 is a structure such as an interposer 220. The interposer 220 may also be a silicon chip with through vias or a redistribution line.

The interposer 220 is attached to the active side 214 of the integrated circuit 212 with a wire-in-film adhesive 222. The wire-in-film adhesive 222 has a low viscosity and, as temperature increases, the viscosity gets lower.

Therefore, the wire-in-film adhesive 222 can be easily pressed over the bond wires 216, above, and around the integrated circuit 212 and then cured to harden the wire-in-film adhesive 222.

It has been discovered that the wire-in-film adhesive 222 should be a thermally conductive dielectric material. The wire-in-film adhesive 222 can be made of a B-stage material that can be hardened after curing and can maintain a predetermined thickness.

The integrated circuit 212 and the bond wires 216 are encapsulated by an encapsulation 224 such as an epoxy mold compound or a film assisted molding. The exposed interconnects 208 are partially encapsulated by the encapsulation 224 and are exposed on an upper surface 226 of the exposed interconnect 208.

The exposed interconnect 208 has a stacked internal structure 228. The stacked internal structure 228 of the exposed interconnect 208 may be stacked by drilling and filling the encapsulation 224 with the stacked internal structure 228.

The stacked internal structure 228 may also be made by successive layers of electroplating and applying layers of photo resist, then stripping the photo resist leaving the exposed interconnect 208 stacked. The exposed interconnect 208 may then be encapsulated by the encapsulation 224.

Still another method of stacking the exposed interconnect 208 may be successive electroplating, encapsulating, planning back the encapsulation 224, electroplating, and encapsulating.

Between the first package 202 and the second package 102 is a package such as an inner package 232 such as a wafer level chip scale package (WLCSP), a redistributed line (RDL) die, or an area array package. The inner package 232 is connected to the interposer 220 of the first package 202 with the solder balls 206.

Above the inner package 232, the second package 102 is shown having a second substrate 234 such as a laminated plastic or ceramic substrate. Above the second substrate 234 is mounted a second integrated circuit 236 such as a wire-bonded die with an active side 238.

Mounted above the second integrated circuit 236 is a third integrated circuit 240 such as a wire-bonded die with an active side 242. The active side 242 of the third integrated circuit 240 and the active side 238 of the second integrated circuit 236 are connected to the second substrate 234 with the die attach adhesive 218.

The third integrated circuit 240 is attached to the second integrated circuit 236 with the wire-in-film adhesive 222. The second integrated circuit 236 and the third integrated circuit 240 are encapsulated by a second encapsulation 244.

Figure 3:
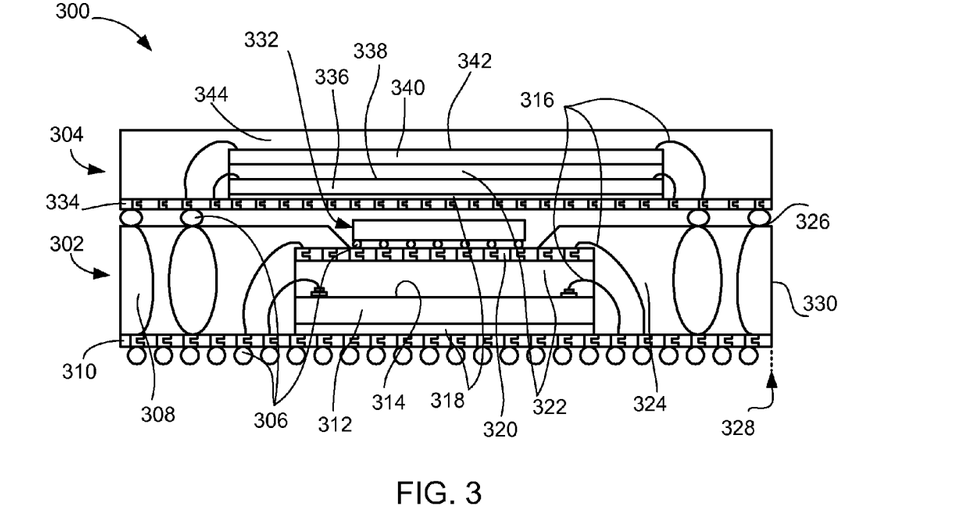
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 is shown having a first package 302 with a second package 304 mounted above.

The second package 304 is connected to the first package 302 with interconnections such as solder balls 306. The solder balls 306 connecting the first package 302 to the second package 304 are connected to exposed interconnects 308. The exposed interconnects 308 may be solder balls, conductive pins, or through vias.

It has been discovered that the use of the exposed interconnects 308 allow for an inexpensive solution to previously difficult and expensive problems of routing signals vertically through package on package systems.

The exposed interconnects 308 are mounted above a substrate 310 such as a laminated plastic or a ceramic substrate.

Also mounted above the substrate 310 is an integrated circuit 312 such as a wire-bonded die with an active side 314.

The active side 314 is connected to the substrate 310 with interconnects such as bond wires 316. Below the substrate are mounted the solder balls 306.

The integrated circuit 312 is attached to the substrate 310 with a die attach adhesive 318. Mounted above the integrated circuit 312 is a structure such as an interposer 320. The interposer 320 may also be a silicon chip with through vias or a redistribution line.

The interposer 320 is attached to the active side 314 of the integrated circuit 312 with a wire-in-film adhesive 322. The wire-in-film adhesive 322 has a low viscosity and, as temperature increases, the viscosity gets lower.

Therefore, the wire-in-film adhesive 322 can be easily pressed over the bond wires 316, above, and around the integrated circuit 312 and then cured to harden the wire-in-film adhesive 322.

It has been discovered that the wire-in-film adhesive 322 should be a thermally conductive dielectric material. The wire-in-film adhesive 322 can be made of a B-stage material that can be hardened after curing and can maintain a predetermined thickness.

The integrated circuit 312 and the bond wires 316 are encapsulated by an encapsulation 324 such as an epoxy mold compound or a film assisted molding. The exposed interconnects 308 are partially encapsulated by the encapsulation 324 and are exposed on an upper surface 326 of the exposed interconnect 308.

The exposed interconnect 308 has a bare side 328, which exposes the exposed interconnect 308 on a side 330 of the encapsulation 324. The bare side 328 of the exposed interconnect 308 provides extra flexibility when connecting or integrating the first package 302 with other subassemblies or systems. The bare side 328 of the exposed interconnect 308 may be made using a saw or a laser.

Between the first package 302 and the second package 304 is an inner package 332 such as a wafer level chip scale package (WLCSP), a redistributed line (RDL) die, or an area array package. The inner package 332 is connected to the interposer 320 of the first package 302 with the solder balls 306.

Above the inner package 332, the second package 304 is shown having a second substrate 334 such as a laminated plastic or ceramic substrate. Above the second substrate 334 is mounted a second integrated circuit 336 such as a wire-bonded die with an active side 338.

Mounted above the second integrated circuit 336 is a third integrated circuit 340 such as a wire-bonded die with an active side 342. The active side 342 of the third integrated circuit 340 and the active side 338 of the second integrated circuit 336 are connected to the second substrate 334 with the die attach adhesive 318.

The third integrated circuit 340 is attached to the second integrated circuit 336 with the wire-in-film adhesive 322. The second integrated circuit 336 and the third integrated circuit 340 are encapsulated by a second encapsulation 344.

Figure 4:
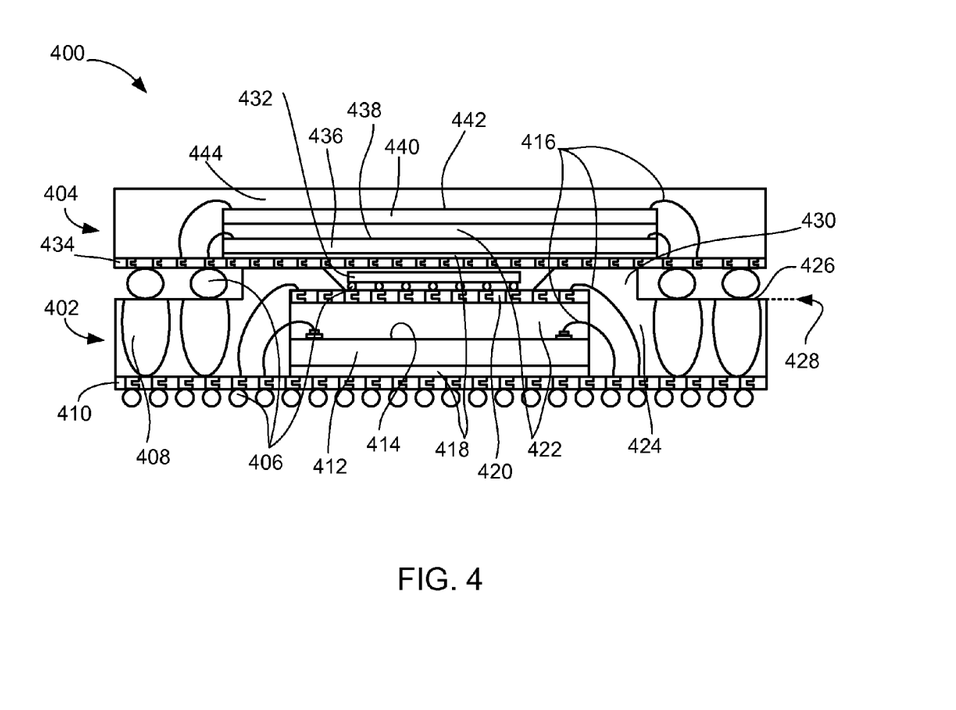
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 is shown having a first package 402 with a second package 404 mounted above.

The second package 404 is connected to the first package 402 with interconnections such as solder balls 406. The solder balls 406 connecting the first package 402 to the second package 404 are connected to exposed interconnects 408. The exposed interconnects 408 may be solder balls, conductive pins, or through vias.

It has been discovered that the use of the exposed interconnects 408 allow for an inexpensive solution to previously difficult and expensive problems of routing signals vertically through package on package systems.

The exposed interconnects 408 are mounted above a substrate 410 such as a laminated plastic or a ceramic substrate. Also mounted above the substrate 410 is an integrated circuit 412 such as a wire-bonded die with an active side 414.

The active side 414 is connected to the substrate 410 with interconnects such as bond wires 416. Below the substrate are mounted the solder balls 406.

The integrated circuit 412 is attached to the substrate 410 with a die attach adhesive 418. Mounted above the integrated circuit 412 is a structure such as an interposer 420. The interposer 420 may also be a silicon chip with through vias or a redistribution line.

The interposer 420 is attached to the active side 414 of the integrated circuit 412 with a wire-in-film adhesive 422. The wire-in-film adhesive 422 has a low viscosity and, as temperature increases, the viscosity gets lower.

Therefore, the wire-in-film adhesive 422 can be easily pressed over the bond wires 416, above, and around the integrated circuit 412 and then cured to harden the wire-in-film adhesive 422.

It has been discovered that the wire-in-film adhesive 422 should be a thermally conductive dielectric material. The wire-in-film adhesive 422 can be made of a B-stage material that can be hardened after curing and can maintain a predetermined thickness.

The integrated circuit 412 and the bond wires 416 are encapsulated by an encapsulation 424 such as an epoxy mold compound or a film assisted molding. The exposed interconnects 408 are partially encapsulated by the encapsulation 424 and are exposed on an upper surface 426 of the exposed interconnect 408.

The exposed interconnect 408 has a bare top 428, which exposes the exposed interconnect 408 on the upper surface 426.

By recessing the exposed interconnects 408 below a mold riser 430 of the encapsulation 424, the second package 404 may rest on and be supported by the mold riser 430 of the encapsulation 424 instead of being supported entirely by the solder balls 406.

The bare top 428 may be made using step molding and the exposed interconnects 408 may be recessed by coining.

Between the first package 402 and the second package 404 is an inner package 432 such as a wafer level chip scale package (WLCSP), a redistributed line (RDL) die, or an area array package. The inner package 432 is connected to the interposer 420 of the first package 402 with the solder balls 406.

Above the inner package 432, the second package 404 is shown having a second substrate 434 such as a laminated plastic or ceramic substrate. Above the second substrate 434 is mounted a second integrated circuit 436 such as a wire-bonded die with an active side 438.

Mounted above the second integrated circuit 436 is a third integrated circuit 440 such as a wire-bonded die with an active side 442. The active side 442 of the third integrated circuit 440 and the active side 438 of the second integrated circuit 436 are connected to the second substrate 434 with the die attach adhesive 418.

The third integrated circuit 440 is attached to the second integrated circuit 436 with the wire-in-film adhesive 422. The second integrated circuit 436 and the third integrated circuit 440 are encapsulated by a second encapsulation 444.

Figure 5:
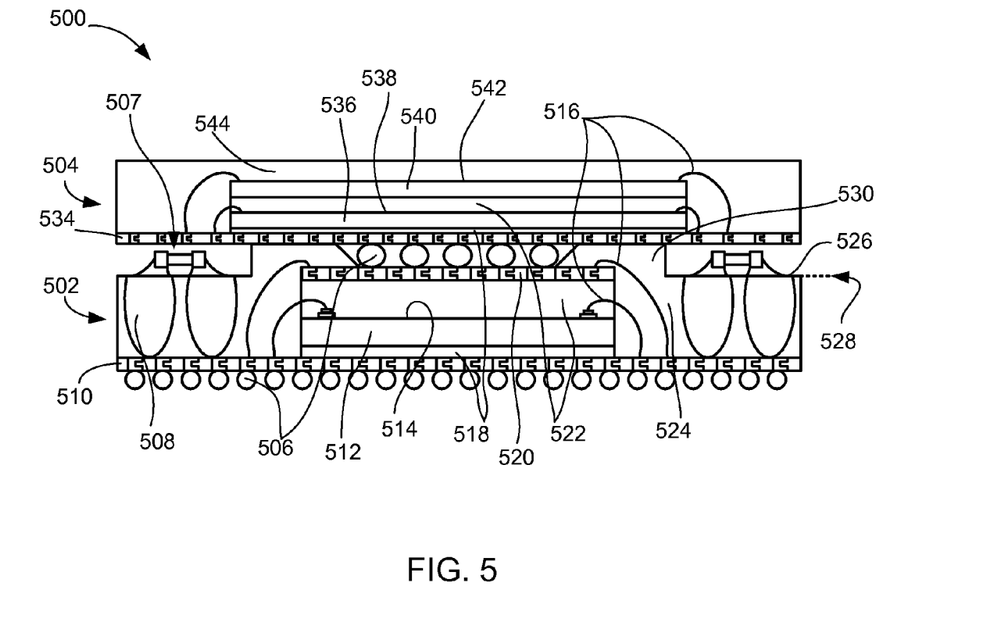
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 is shown having a first package 502 with a second package 504 mounted above.

The second package 504 is connected to the first package 502 with interconnections such as solder balls 506. Between the first package 502 and the second package 504 are passive components 507 connected to exposed interconnects 508. The exposed interconnects 508 may be solder balls, conductive pins, or through vias.

It has been discovered that the use of the exposed interconnects 508 allow for an inexpensive solution to previously difficult and expensive problems of routing signals vertically through package on package systems.

The exposed interconnects 508 are mounted above a substrate 510 such as a laminated plastic or a ceramic substrate. Also mounted above the substrate 510 is an integrated circuit 512 such as a wire-bonded die with an active side 514.

The active side 514 is connected to the substrate 510 with interconnects such as bond wires 516. Below the substrate are mounted the solder balls 506.

The integrated circuit 512 is attached to the substrate 510 with a die attach adhesive 518. Mounted above the integrated circuit 512 is a structure such as an interposer 520. The interposer 520 may also be a silicon chip with through vias or a redistribution line.

The interposer 520 is attached to the active side 514 of the integrated circuit 512 with a wire-in-film adhesive 522. The wire-in-film adhesive 522 has a low viscosity and, as temperature increases, the viscosity gets lower.

Therefore, the wire-in-film adhesive 522 can be easily pressed over the bond wires 516, above, and around the integrated circuit 512 and then cured to harden the wire-in-film adhesive 522.

It has been discovered that the wire-in-film adhesive 522 should be a thermally conductive dielectric material. The wire-in-film adhesive 522 can be made of a B-stage material that can be hardened after curing and can maintain a predetermined thickness.

The integrated circuit 512 and the bond wires 516 are encapsulated by an encapsulation 524 such as an epoxy mold compound or a film assisted molding. A portion of each of the exposed interconnects 508 is partially encapsulated by the encapsulation 524 and the exposed interconnects 508 are exposed on an upper surface 526 of the exposed interconnect 508.

The exposed interconnect 508 has a bare top 528, which exposes the exposed interconnect 508 on the upper surface 526.

By recessing the exposed interconnects 508 below a mold riser 530 of the encapsulation 524, the second package 504 may rest on and be supported by the mold riser 530 of the encapsulation 524 instead of being supported entirely by the solder balls 506. The mold riser 530 extends above and exposes a portion of the interposer 520, under the second package 504, and between ends of the interposer 520 covered by the encapsulation 524.

The bare top 528 may be made using step molding and the exposed interconnects 508 may be recessed by coining.

The second package 504 is shown having a second substrate 534 such as a laminated plastic or ceramic substrate. Above the second substrate 534 is mounted a second integrated circuit 536 such as a wire-bonded die with an active side 538.

Mounted above the second integrated circuit 536 is a third integrated circuit 540 such as a wire-bonded die with an active side 542. The active side 542 of the third integrated circuit 540 and the active side 538 of the second integrated circuit 536 are connected to the second substrate 534 with the die attach adhesive 518.

The third integrated circuit 540 is attached to the second integrated circuit 536 with the wire-in-film adhesive 522. The second integrated circuit 536 and the third integrated circuit 540 are encapsulated by a second encapsulation 544.

Figure 6:
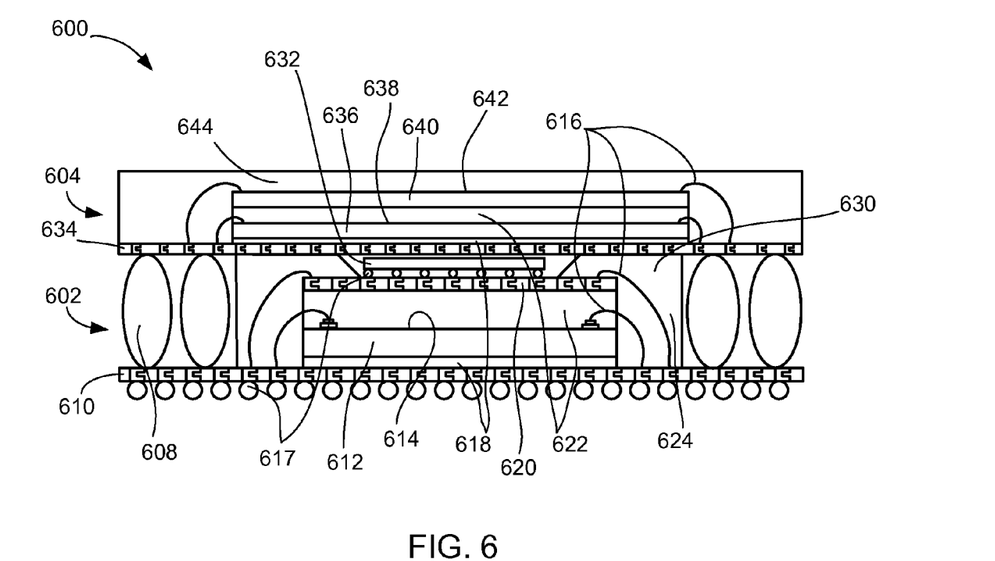
FIG. 6 is a cross-sectional view of an integrated circuit package system in a fifth embodiment of the present invention.

Referring now to FIG. 6, therein is shown a cross-sectional view of an integrated circuit package system 600 in a fifth embodiment of the present invention. The integrated circuit package system 600 is shown having a first package 602 with a second package 604 mounted above.

The second package 604 is connected to the first package 602 with exposed interconnects 608. The exposed interconnects 608 may be solder balls, conductive pins, or through vias.

It has been discovered that the use of the exposed interconnects 608 allow for an inexpensive solution to previously difficult and expensive problems of routing signals vertically through package on package systems.

The exposed interconnects 608 are mounted above a substrate 610 such as a laminated plastic or a ceramic substrate. Also mounted above the substrate 610 is an integrated circuit 612 such as a wire-bonded die with an active side 614.

The active side 614 is connected to the substrate 610 with interconnects such as bond wires 616. Below the substrate are mounted the solder balls 617.

The integrated circuit 612 is attached to the substrate 610 with a die attach adhesive 618. Mounted above the integrated circuit 612 is a structure such as an interposer 620. The interposer 620 may also be a silicon chip with through vias or a redistribution line.

The interposer 620 is attached to the active side 614 of the integrated circuit 612 with a wire-in-film adhesive 622. The wire-in-film adhesive 622 has a low viscosity and, as temperature increases, the viscosity gets lower.

Therefore, the wire-in-film adhesive 622 can be easily pressed over the bond wires 616, above, and around the integrated circuit 612 and then cured to harden the wire-in-film adhesive 622.

It has been discovered that the wire-in-film adhesive 622 should be a thermally conductive dielectric material. The wire-in-film adhesive 622 can be made of a B-stage material that can be hardened after curing and can maintain a predetermined thickness.

The integrated circuit 612 and the bond wires 616 are encapsulated by an encapsulation 624 such as an epoxy mold compound or a film assisted molding. The exposed interconnects 608 are not encapsulated by the encapsulation 624.

The second package 604 may rest on and be supported by a mold riser 630 of the encapsulation 624 instead of being supported entirely by the exposed interconnects 608.

Between the first package 602 and the second package 604 is an inner package 632 such as a wafer level chip scale package (WLCSP), a redistributed line (RDL) die, or an area array package. The inner package 632 is connected to the interposer 620 of the first package 602 with the solder balls 617.

Above the inner package 632, the second package 604 is shown having a second substrate 634 such as a laminated plastic or ceramic substrate. Above the second substrate 634 is mounted a second integrated circuit 636 such as a wire-bonded die with an active side 638.

Mounted above the second integrated circuit 636 is a third integrated circuit 640 such as a wire-bonded die with an active side 642. The active side 642 of the third integrated circuit 640 and the active side 638 of the second integrated circuit 636 are connected to the second substrate 634 with the die attach adhesive 618.

The third integrated circuit 640 is attached to the second integrated circuit 636 with the wire-in-film adhesive 622. The second integrated circuit 636 and the third integrated circuit 640 are encapsulated by a second encapsulation 644.

Figure 7:
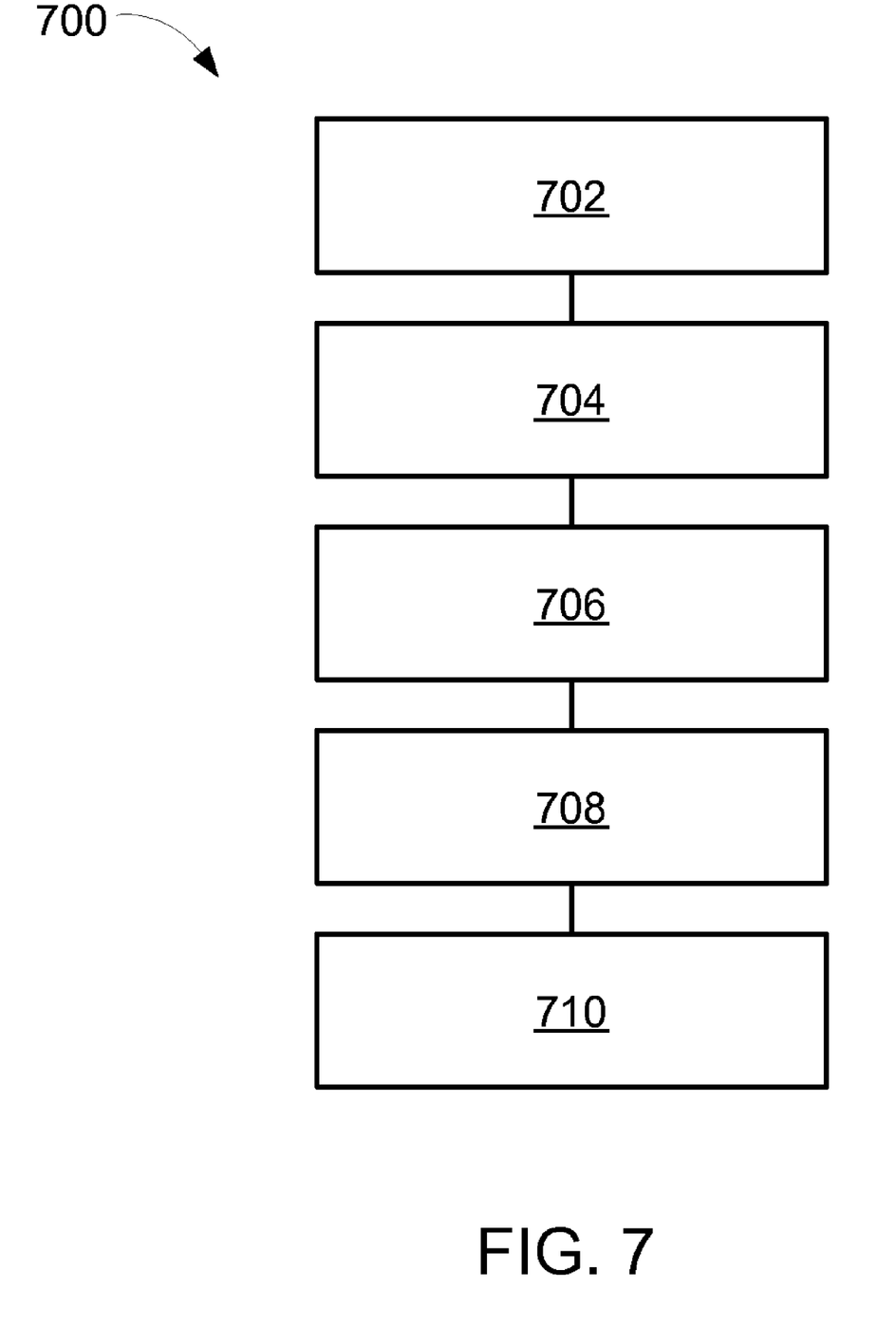
FIG. 7 is a flow chart of a system for manufacturing the integrated circuit package system of FIG. 1 in an embodiment of the present invention.

Referring now to FIG. 7, therein is shown a flow chart of a system 700 for manufacturing the integrated circuit package system 100 of FIG. 1 in an embodiment of the present invention. The system 700 includes providing a substrate in a block 702; mounting an integrated circuit above the substrate in a block 704; connecting an interposer to the integrated circuit with a wire-in-film adhesive in a block 706; connecting an exposed interconnect having an upper surface to the substrate in a block 708; and encapsulating the integrated circuit with an encapsulation in a block 710.

Thus, it has been discovered that the exposed interconnect system of the present invention furnishes important and heretofore unknown and unavailable solutions, capabilities, and functional aspects for package on package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
a substrate;
an integrated circuit mounted above the substrate;
an interposer connected to the integrated circuit with a wire-in-film adhesive;
an exposed interconnect connected to the substrate; and
an encapsulation encapsulating the integrated circuit and a portion of the exposed interconnect, the exposed interconnect exposed from the encapsulation; and
a passive component mounted to the exposed interconnect.

2. The system as claimed in claim 1 further comprising:
an upper surface of the exposed interconnect exposed from the encapsulation.

3. The system as claimed in claim 1 further comprising:
a bare side on the exposed interconnect exposed from the encapsulation.

4. The system as claimed in claim 1 further comprising:
a bare top on the upper surface of the exposed interconnect exposed from the encapsulation.

5. The system as claimed in claim 1 further comprising:
a package mounted above the interposer.

6. The system as claimed in claim 5 wherein:
the exposed interconnect has a stacked structure.

7. The system as claimed in claim 5 wherein:
the package is electrically connected to the interposer or to the exposed interconnect.

8. The system as claimed in claim 5 wherein:
the package is mounted on the encapsulation and over the interposer.

9. The system as claimed in claim 5 further comprising:
an inner package mounted to the interposer.

10. A method for manufacturing an integrated circuit package system comprising:
providing a substrate;
mounting an integrated circuit above the substrate;
connecting an interposer to the integrated circuit with a wire-in-film adhesive;
connecting an exposed interconnect having an upper surface to the substrate;
encapsulating the integrated circuit and a portion of the exposed interconnect with an encapsulation, the exposed interconnect exposed from the encapsulation; and
mounting a passive component to the exposed interconnect.

11. The method as claimed in claim 1 wherein:
encapsulating includes encapsulating the exposed interconnect having the upper surface of the exposed interconnect exposed.

12. The method as claimed in claim 1 wherein:
encapsulating includes encapsulating the exposed interconnect having the upper surface of the exposed interconnect exposed; and
further comprising:
forming a bare side on the exposed interconnect.

13. The method as claimed in claim 1 wherein:
encapsulating includes encapsulating the exposed interconnect; and
further comprising:
forming a bare top on the upper surface of the exposed interconnect.

14. A method for manufacturing an integrated circuit package system comprising:
providing a substrate;
mounting an integrated circuit above the substrate;
connecting an interposer to the integrated circuit with a wire-in-film adhesive;
connecting an exposed interconnect having an upper surface to the substrate;
encapsulating the integrated circuit and a portion of the exposed interconnect with an encapsulation having a mold riser above the interposer, the exposed interconnect exposed from the encapsulation; and
mounting a passive component to the exposed interconnect.

15. The method as claimed in claim 14 wherein:
connecting the exposed interconnect includes forming the exposed interconnect having a stacked structure.

16. The method as claimed in claim 14 further comprising:
connecting a second package electrically to the interposer or to the exposed interconnect.

17. The method as claimed in claim 14 further comprising:
mounting a package on the encapsulation and over the interposer.

18. The method as claimed in claim 14 further comprising:
connecting an inner package to the interposer.

* * * * *

UNITED STATES PATENT AND TRADEMARK OFFICE
CERTIFICATE OF CORRECTION

PATENT NO. : 8,270,176 B2  
APPLICATION NO. : 12/188995  
DATED : September 18, 2012  
INVENTOR(S) : Pagaila et al.

Page 1 of 1

It is certified that error appears in the above-identified patent and that said Letters Patent is hereby corrected as shown below:

In the Claims:

Column 10, claim 11, line 22, delete "as claimed in claim 1" and insert therefor
--as claimed in claim 10--

Column 10, claim 12, line 26, delete "as claimed in claim 1" and insert therefor
--as claimed in claim 10--

Column 10, claim 13, line 32, delete "as claimed in claim 1" and insert therefor
--as claimed in claim 10--

Signed and Sealed this
First Day of December, 2015

Michelle K. Lee
*Director of the United States Patent and Trademark Office*